United States Patent
Drogi et al.

(10) Patent No.: US 7,782,134 B2
(45) Date of Patent: Aug. 24, 2010

(54) RF POWER AMPLIFIER SYSTEM WITH IMPEDANCE MODULATION

(75) Inventors: Serge Francois Drogi, Flagstaff, AZ (US); Vikas Vinayak, Menlo Park, CA (US)

(73) Assignee: Quantance, Inc., San Mateo, CA (US)

( * ) Notice: Subject to any disclaimer, the term of this patent is extended or adjusted under 35 U.S.C. 154(b) by 0 days.

(21) Appl. No.: 12/366,568

(22) Filed: Feb. 5, 2009

(65) Prior Publication Data

US 2010/0060357 A1  Mar. 11, 2010

Related U.S. Application Data

(60) Provisional application No. 61/095,605, filed on Sep. 9, 2008.

(51) Int. Cl.
H03G 3/20 (2006.01)
(52) U.S. Cl. .................. 330/136; 330/129; 330/302
(58) Field of Classification Search .......... 330/127, 330/129, 136, 297, 302
See application file for complete search history.

(56) References Cited

U.S. PATENT DOCUMENTS

| | | | |
|---|---|---|---|
| 3,900,823 A | 8/1975 | Sokol et al. | |
| 5,142,240 A | 8/1992 | Isota et al. | |
| 5,276,912 A | 1/1994 | Siwiak et al. | |
| 5,564,086 A | 10/1996 | Cygan et al. | |
| 5,675,288 A | 10/1997 | Peyrotte et al. | |
| 5,822,442 A | 10/1998 | Agnew et al. | |
| 5,880,633 A | 3/1999 | Leizerovich et al. | |
| 6,133,792 A | 10/2000 | Hansson | |
| 6,141,541 A | 10/2000 | Midya et al. | |
| 6,166,596 A | 12/2000 | Higashiyama et al. | |
| 6,175,273 B1 | 1/2001 | Sigmon et al. | |
| 6,300,826 B1 | 10/2001 | Mathe et al. | |
| 6,377,784 B2 | 4/2002 | McCune | |
| 6,404,823 B1 | 6/2002 | Grange et al. | |
| 6,437,641 B1 | 8/2002 | Bar-David | |
| 6,438,360 B1 * | 8/2002 | Alberth et al. | ............. 330/129 |
| 6,445,249 B1 | 9/2002 | Khan et al. | |
| 6,449,465 B1 * | 9/2002 | Gailus et al. | ............. 330/136 |

(Continued)

FOREIGN PATENT DOCUMENTS

EP    0812064 B1    9/2003

(Continued)

OTHER PUBLICATIONS

Buisman, K. et al., ""Distortion-Free" Varactor Diode Topologies for RF Adaptivity," Microwave Symposium Digest, 2005 IEEE MTT-S International Volume, Jun. 12-17, 2005, pp. 157-160.

(Continued)

*Primary Examiner*—Khanh V Nguyen
(74) *Attorney, Agent, or Firm*—Fenwick & West LLP

(57) ABSTRACT

A power amplifier controller circuit controls an adjustable impedance matching network at the output of a power amplifier to vary its load line to improve the efficiency of the RF PA. The PA controller circuit comprises an amplitude control loop that determines an amplitude correction signal. The amplitude loop is configured to control or correct for distortion from the adjustable matching network based upon the amplitude correction signal.

24 Claims, 15 Drawing Sheets

U.S. PATENT DOCUMENTS

| | | | |
|---|---|---|---|
| 6,472,934 | B1 | 10/2002 | Pehlke |
| 6,528,975 | B2 | 3/2003 | Sander |
| 6,583,664 | B2 | 6/2003 | Mathe et al. |
| 6,654,595 | B1 | 11/2003 | Dexter |
| 6,661,210 | B2 | 12/2003 | Kimball et al. |
| 6,768,472 | B2 | 7/2004 | Alexopoulos et al. |
| 6,781,452 | B2 | 8/2004 | Cioffi et al. |
| 6,917,244 | B2 | 7/2005 | Rosnell et al. |
| 6,924,695 | B2 | 8/2005 | Cioffi et al. |
| 6,924,711 | B2 | 8/2005 | Liu |
| 6,946,908 | B1 | 9/2005 | Sun et al. |
| 7,057,464 | B2 | 6/2006 | Bharj |
| 7,183,844 | B2 | 2/2007 | Klomsdorf et al. |
| 7,202,747 | B2 | 4/2007 | Forse et al. |
| 2002/0053897 | A1 | 5/2002 | Kajiwara et al. |
| 2002/0168949 | A1 | 11/2002 | Johannisson et al. |
| 2003/0017840 | A1 | 1/2003 | Katagishi et al. |
| 2003/0155978 | A1 | 8/2003 | Pehlke |
| 2004/0071225 | A1 | 4/2004 | Suzuki et al. |
| 2004/0189378 | A1 | 9/2004 | Suzuki et al. |
| 2004/0263254 | A1 | 12/2004 | Tahara et al. |
| 2005/0064830 | A1 | 3/2005 | Grigore |
| 2005/0122163 | A1 | 6/2005 | Chu |
| 2005/0242880 | A1 | 11/2005 | Domokos et al. |
| 2006/0001483 | A1 | 1/2006 | Cioffi et al. |
| 2007/0184793 | A1 | 8/2007 | Drogi et al. |
| 2007/0184795 | A1 | 8/2007 | Drogi et al. |
| 2007/0184796 | A1 | 8/2007 | Drogi et al. |

FOREIGN PATENT DOCUMENTS

| | | |
|---|---|---|
| WO | WO 9534128 | 12/1995 |

OTHER PUBLICATIONS

"The Changing Face of Amplifier Design," Nujira, [online] [Retrieved on Apr. 5, 2006] Retrieved from the Internet<URL:http://www.nujira.com/technology/>.

Fergus, T.J., "EDGE Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD8302'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

Neo, W.C.E. et al., "Improved Hybrid SiGe HBT Class-AB Power Amplifier Efficiency Using Varactor-Based Tunable Matching Networks," Proceedings of the Bipolar/BiCMOS Circuits and Technology Meeting 7.2, IEEE, Oct. 9-11, 2005, pp. 108-111.

Raab, F. et al., "RF and Microwave Power Amplifier and Transmitter Technologies—Part 3," High Frequency Electronics, Sep. 2003, pp. 34-48.

Raab, F. et al., "RF and Microware Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

International Search Report and Written Opinion, PCT Application No. PCT/US2009/054583, Oct. 13, 2009, 7 pages.

* cited by examiner

RF POWER AMPLIFIER SYSTEM WITH
IMPEDANCE MODULATION

CROSS-REFERENCE TO RELATED
APPLICATION

This application claims priority under 35 U.S.C. §119(e) from U.S. Provisional Patent Application No. 61/095,605, entitled "RF Power Amplifier Controller Circuit with Impedance Modulation," filed on Sep. 9, 2008, the subject matter of which is incorporated by reference herein in its entirety.

BACKGROUND OF THE INVENTION

1. Field of the Invention

The present invention relates to a circuit for controlling RF PAs (Radio Frequency Power Amplifiers), and more specifically, to an RF PA controller circuit that includes control of an adjustable matching network at the output of the PA.

2. Description of the Related Arts

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life on these portable electronic devices. For example, cellular telephone makers make great efforts to increase the efficiency of the RF PA circuits, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic device. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) for its last amplification stage. When an RF modulated signal 106 is amplified by the RF PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak part of the amplitude of the RF input signal 106, as the biasing remains fixed for the acceptable distortion at the peak power level.

Thus, there is a need for an RF PA system that is efficient over a wide variety of modulation techniques and results in a significant net decrease in power consumption by the RF PA circuit.

SUMMARY OF THE INVENTION

Embodiments of the present invention include a power amplifier controller circuit that controls an adjustable impedance matching network at the output of a power amplifier to improve the efficiency of the RF PA. In a first embodiment of the present invention, the PA controller circuit comprises an amplitude control loop that determines an amplitude correction signal (also referred to herein as the amplitude error signal) that is indicative of the amplitude difference between the amplitude of the input signal and the attenuated amplitude of the output signal of the power amplifier. The amplitude correction signal controls the adjustable matching network in order to dynamically adjust the load line of the PA to improve PA efficiency during an off-peak part of the amplitude of the RF signal.

In a second embodiment of the present invention, the amplitude correction signal is split into two signals, with one signal controlling the adjustable matching network as in the first embodiment, and the other signal controlling a power supply which powers the PA. In addition, a phase correction loop may be added to the second embodiment to correct for unwanted phase modulation introduced by the AM to PM non-ideality of the PA or adjustable matching network, thereby reducing phase distortion at the output of the PA.

In a third embodiment of the present invention, the amplitude correction signal is split into two or more signals, with one signal controlling the adjustable matching network and at least one other signal controlling at least one other gain adjusting element within the amplitude correction loop. The latter gain adjusting element provides a means for the amplitude control loop to correct for any non-monotonicity within the control-to-gain transfer function of the adjustable matching network, as well as distortion caused by the network. As in the second embodiment, a phase correction loop may be added to the third embodiment to correct for unwanted phase modulation introduced by the AM to PM non-ideality of the PA or the adjustable matching network, and thereby reducing phase distortion at the output.

A fourth embodiment of the present invention is similar to the third embodiment, except that the adjustable matching network is controlled by a signal derived from the amplitude of the RF signal handled by the PA or based on average distortion levels at the output of the PA, rather than a signal derived from the amplitude correction signal. The adjustable matching network thus dynamically adjusts the load line of the PA based on the amplitude or distortion of the RF signal to improve the PA efficiency, while the amplitude correction loop corrects for any distortion caused by the adjustable matching network by controlling a gain adjusting element within the loop. As in the third embodiment, a phase correction loop may be added to the fourth embodiment to correct for unwanted phase modulation introduced by the AM to PM non-ideality of the PA or the adjustable matching network, and thereby reducing phase distortion at the output.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Generally, a power amplifier controller circuit controls an adjustable impedance matching network at the output of a power amplifier to improve the efficiency of the RF PA.

Figure 1:
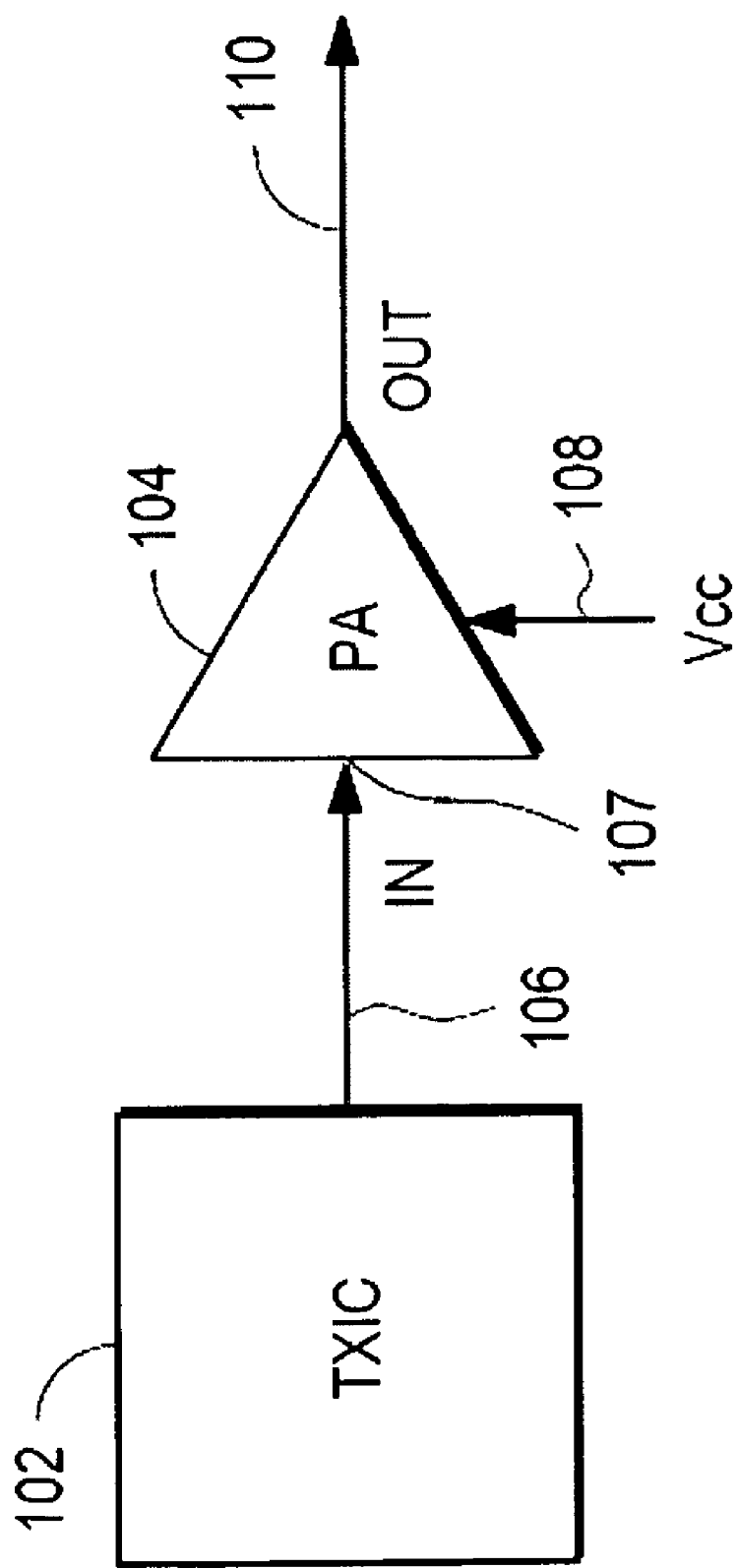
FIG. 1 illustrates a conventional RF transmitter circuit, including a transmitter integrated circuit (TXIC) 102 and an external power amplifier (PA) 104.
Figure 2:
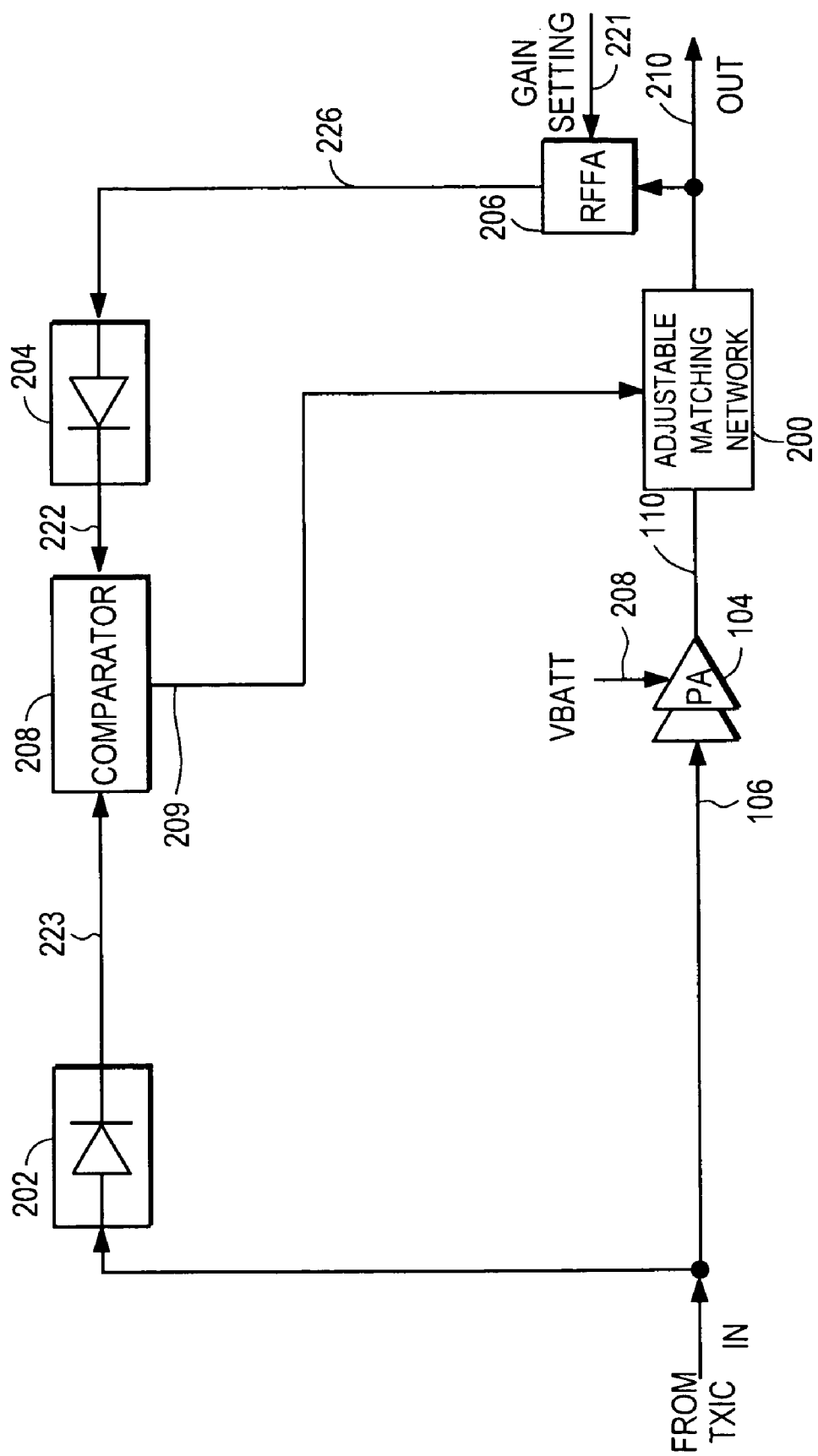
FIG. 2 illustrates an RF PA controller circuit, according to a first embodiment of the present invention.

FIG. 2 illustrates an RF PA controller circuit, according to a first embodiment of the present invention. A power amplifier (PA) 104 receives and amplifies an input signal 106 provided from a transmitter IC (TXIC) to the power amplifier 104, and generates an output signal 110. The RF PA controller circuit, comprised of variable attenuator (RFFA (RF Feedback Attenuator)) 206, amplitude detectors 202, 204, comparator 208, and adjustable matching network 200, controls the adjustable matching network 200 based upon an amplitude correction signal (also referred to as amplitude error signal) 209, so that PA 104 may operate in an efficient manner. PA 104 is powered by a supply voltage VBATT 208.

The PA controller circuit includes an amplitude control loop which determines the amplitude correction signal 209, which is indicative of the amplitude difference between the amplitude of the input signal 106 and the attenuated amplitude 226 of the output signal 210. Comparator 208 receives the amplitude 223 of the input signal and the attenuated amplitude 222 of the output signal 210, via amplitude detectors 202, 204, respectively, and generates the amplitude correction signal 209 that is indicative of the amplitude difference between the amplitude of the input signal 106 and the attenuated amplitude 226 of the output signal 110. Control signal 221 sets the attenuation of adjusted variable attenuator (RFFA (RF Feedback Attenuator)) 206 that attenuates the output 210 of the PA 104 to generate the attenuated output 226. Selection of the attenuation level at RFFA 206 determines the compression level of the PA 104, since a lower attenuation level reduces the closed loop gain and forces the PA 104 to operate more deeply in compression. Variable attenuator 206 may alternatively be replaced by a fixed attenuator.

The amplitude correction signal 209 is provided to adjustable matching network 200 to control the adjustable matching network 200 and adjust the impedance seen by the output of the PA 104, thereby varying the PA load line and the PA output amplitude. Thus the amplitude control loop may correct for PA amplitude errors by controlling this adjustable matching network 200. The adjustable matching network 200 may include components such as varactor diodes whose capacitance can be varied to realize this varying impedance. Further details of the circuitry of adjustable matching network 200 and its operation are provided below with reference to FIG. 9. The adjustable matching network 200 is configured to provide efficient PA operation across a range of load line settings, thus varying the output amplitude of PA 104 while maintaining high efficiency, and improving the overall efficiency of the power amplifier 104. In one embodiment, the amplitude control loop controls the adjustable matching network such that the PA 104 operates in a compression region.

Figure 3:
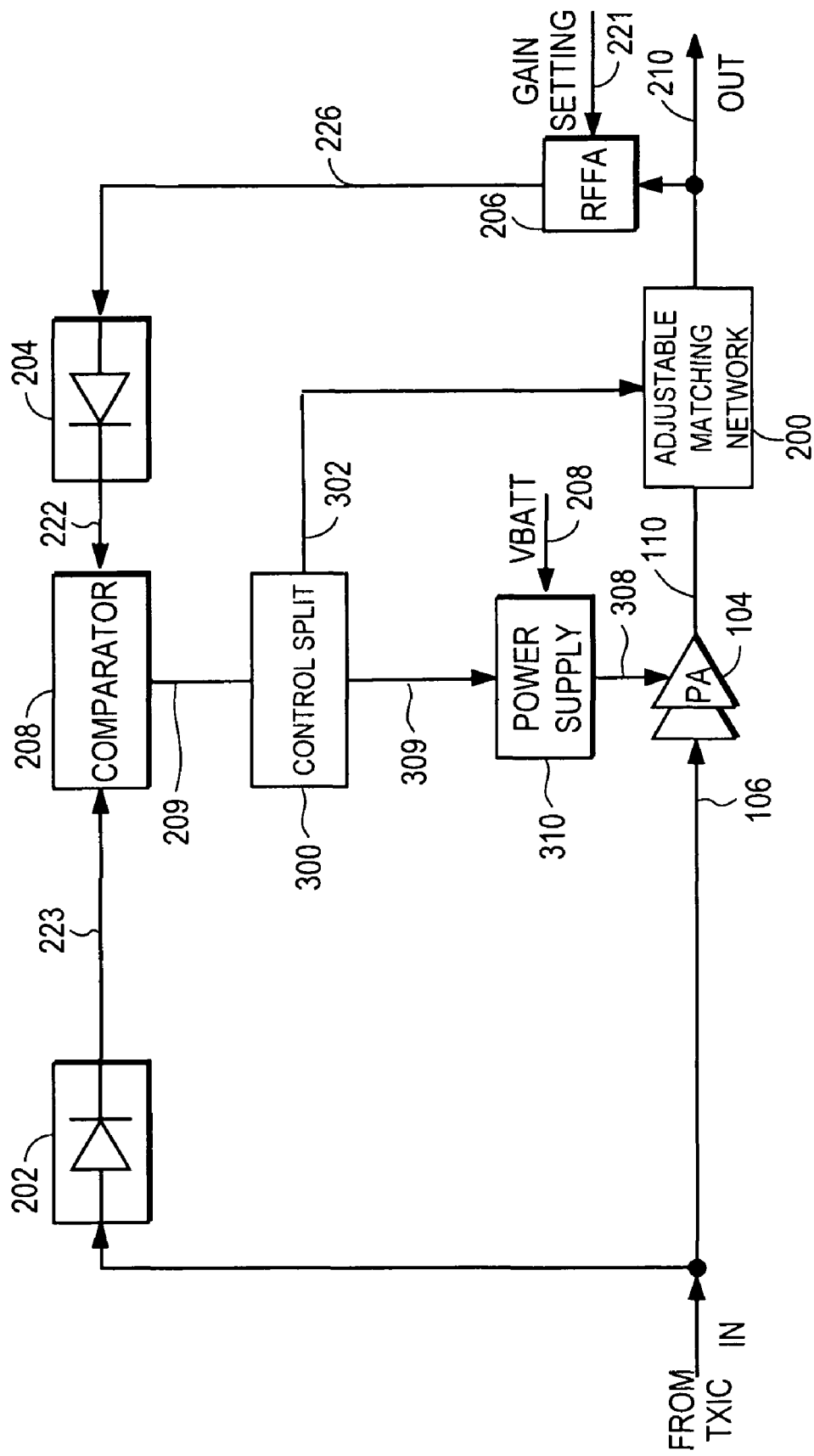
FIG. 3 illustrates an RF PA controller circuit, according to a second embodiment of the present invention.

FIG. 3 illustrates an RF PA controller circuit, according to a second embodiment of the present invention. The RF PA controller circuit of FIG. 3 is substantially the same as the RF PA controller circuit of FIG. 2, except that a power supply 310 and a control split module 300 are added. Battery voltage VBATT 208 powers the power supply 310, which provides a controlled supply voltage 308 to the PA 104. When the PA 104 is operating at or near compression, the supply voltage 308 to the PA 104 can vary the PA output 210 amplitude. Thus, the amplitude control loop may additionally correct for PA amplitude errors by adjusting this PA supply voltage 308. Since the PA supply voltage 308 may be typically supplied by an efficient switching regulator, the PA 104 can operate with high efficiency.

Control split module 300 apportions higher frequency components 302 of the amplitude correction signal 209 to control the adjustable matching network 200, and lower frequency components 309 of the amplitude correction signal to control the power supply 310 that provides the supply voltage 308 to the PA 104. This apportioning of control is advantageous because the power supply 310 may be most efficient if it is a switched-mode type with relatively low control bandwidth, while the adjustable matching network 200 may have a high control bandwidth. The power supply 310 thus may handle the low frequency amplitude correction, while the adjustable matching network 200 handles the higher frequency amplitude correction. Together, the power supply 310 and adjustable matching network 200 provide a high dynamic range of efficient amplitude correction. The control split module 300 may further provide a control means to set the average setting of the adjustable match control signal 302, if only AC components of the amplitude correction signal 209 are passed to the adjustable match control signal 302, as will be explained in more detail below with reference to FIG. 10A. In one embodiment, the amplitude control loop controls the power supply 310 (the average of the adjusted supply voltage 308) such that that the PA 104 operates in a compression region.

Figure 4:
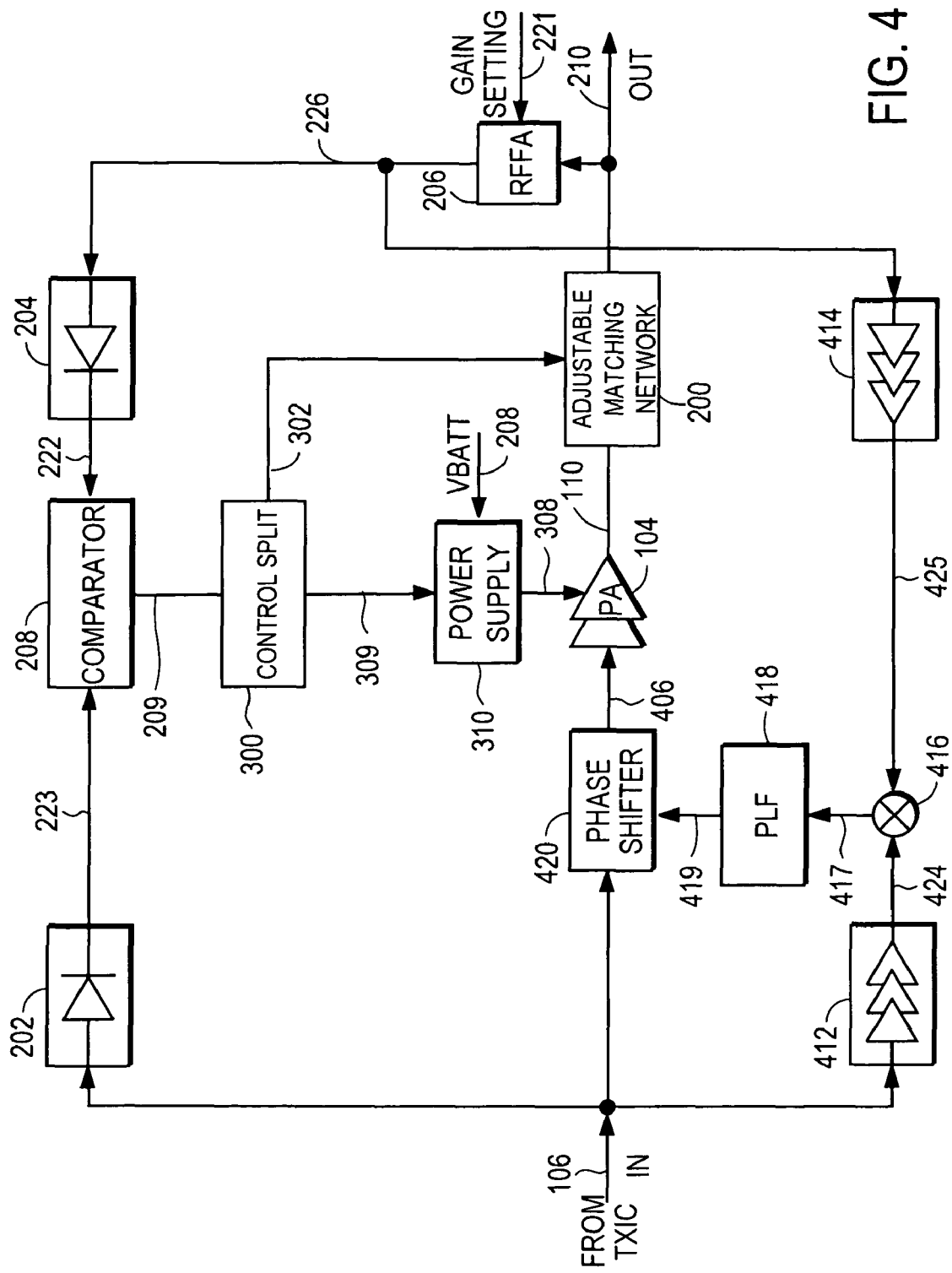
FIG. 4 illustrates an extension of the second embodiment of the present invention described in FIG. 3.

FIG. 4 illustrates an extension of the second embodiment of the present invention described in FIG. 3. The RF PA controller circuit of FIG. 4 is substantially the same as the RF PA controller circuit of FIG. 3, except that a phase control loop is added. The phase control loop includes phase shifter 420, limiters 412, 414, comparator 416, and loop filter (PLF) 418. The phase control loop monitors the RF input signal 106 from the transmitter IC (TXIC) and compares the phase of the RF input signal 106 with the phase of the output signal 210 of the PA 104 attenuated 226 by the adjusted variable attenuator (RFFA) 206, resulting in a phase control signal 419 that varies the phase of the RF signal 406 coming out of the phase shifter 420. More specifically, the limiter 412 receives the RF input signal 106 from the TXIC 102 and outputs to the comparator 416 an amplitude limited signal 424 mathematically representative of the phase of its input signal. The limiter 414 also receives the output signal 210 of the PA 104 as attenuated 226 by the adjusted variable attenuator (RFFA) 206, and outputs its phase signal 425 to the comparator 416. The comparator 416 compares the phases of the output signals 424, 425 of the two limiters 412, 414, and generates a phase error signal 417. The phase error signal 417 is filtered by the loop filter (PLF) 418 to generate the phase control signal 419. The phase control signal 419 is input to the phase shifter 420 to control the shifting of the phase of the input RF signal 406, so that the phase of the output signal 210 dynamically matches the phase of the transmitter signal 106. Thus, the phase control loop corrects for unwanted phase modulation introduced by the AM to PM non-ideality of the power amplifier 104, or the adjustable matching network 200, and thus reduces phase distortion generated at the output 210.

Figure 5A:
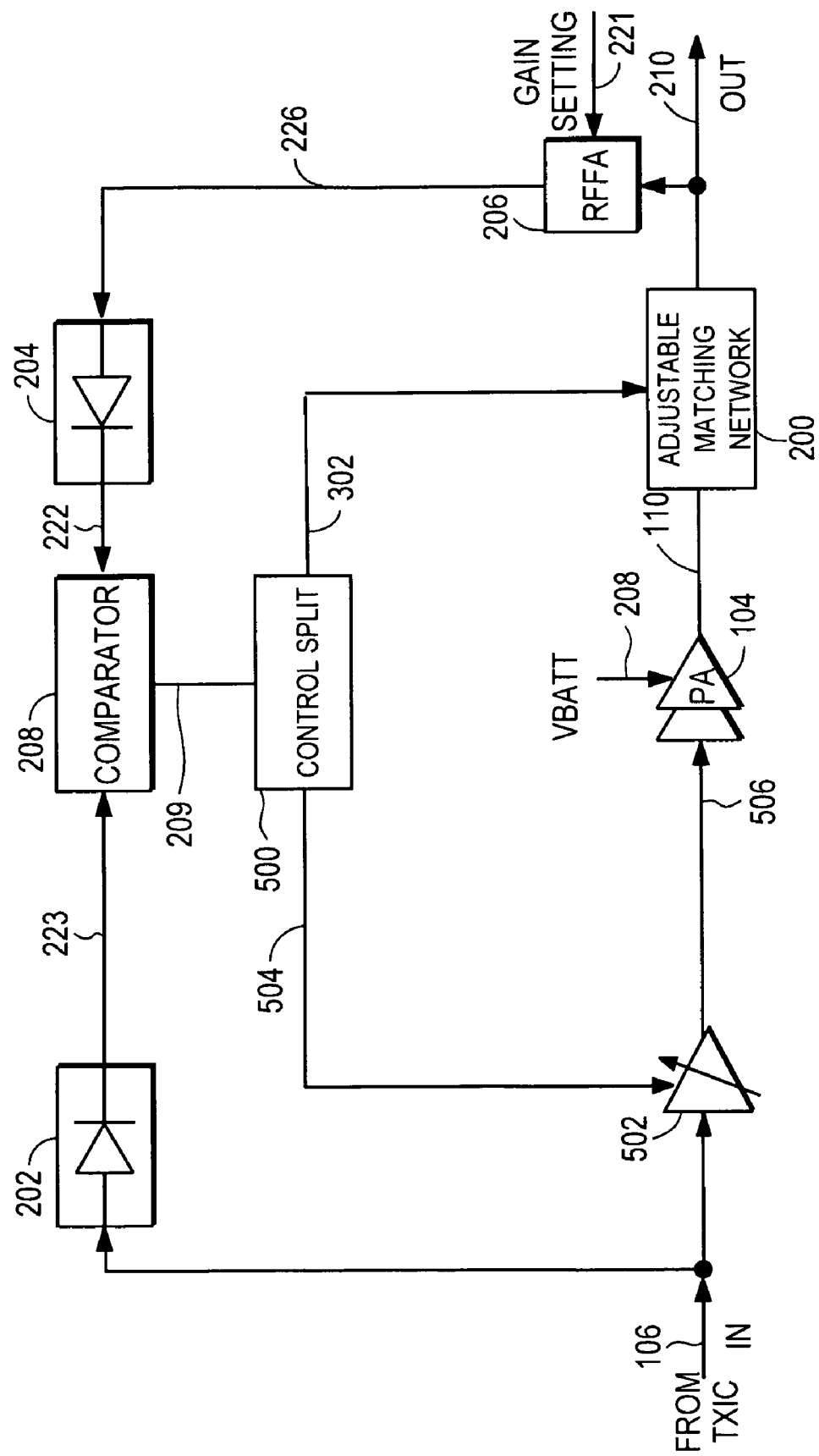
FIGS. 5A, 5B and 5C illustrate variations of an RF PA controller circuit, according to a third embodiment of the present invention.
Figure 5B:
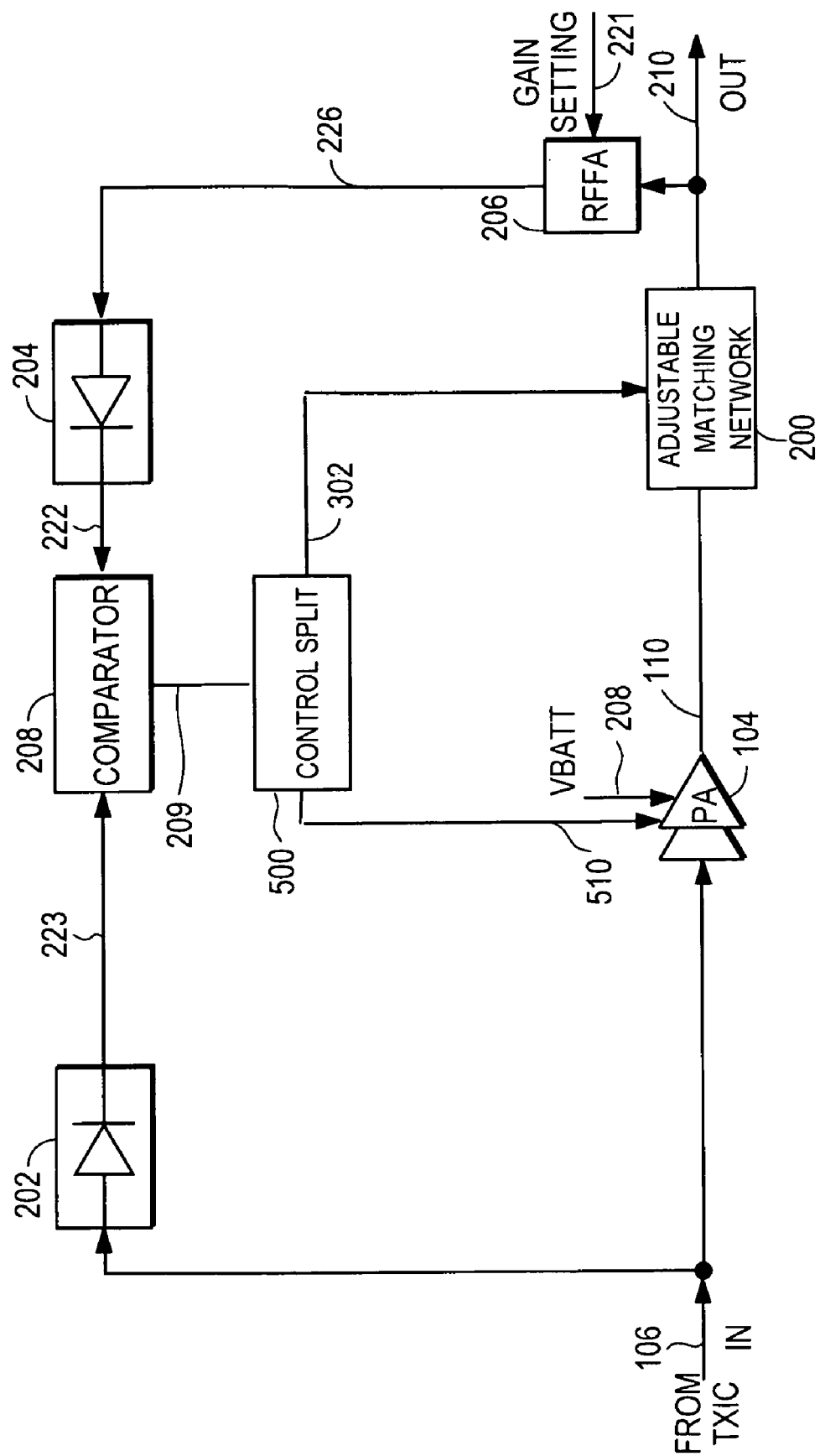
Figure 5C:
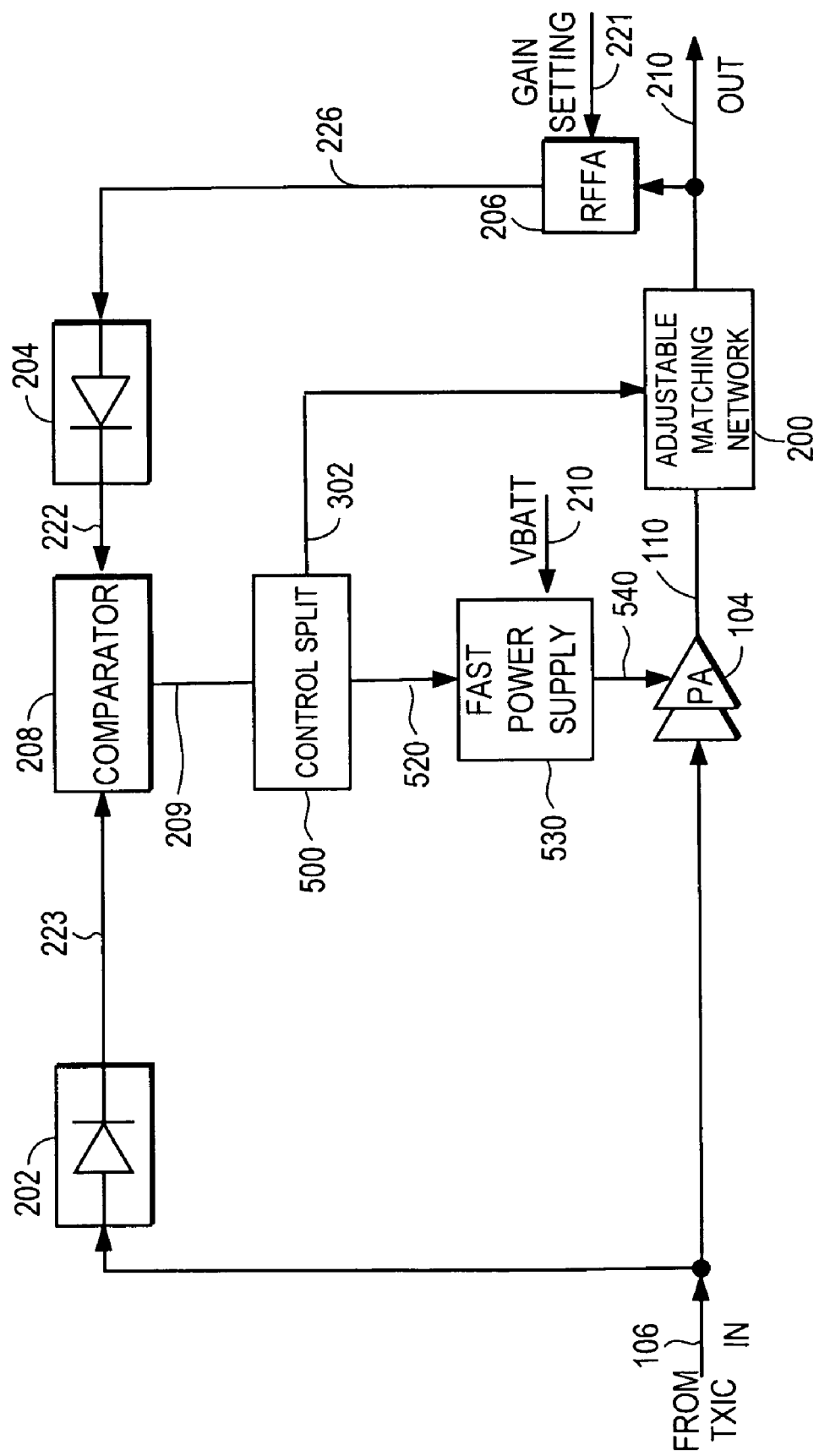

FIGS. 5A, 5B and 5C illustrate variations of an RF PA controller circuit, according to a third embodiment of the present invention. In this embodiment, the amplitude correction signal 209 is split by control split module 500 into two or more signals, with one signal 302 controlling the adjustable matching network 200 and at least one other signal controlling a gain adjustment element within the amplitude correction loop In the embodiments of FIGS. 5A, 5B, and 5C, the amplitude control loop may control the adjustable matching network 200 such that the PA 104 operates in both a compressed region and a linear region.

In the example of FIG. 5A, a variable gain amplifier (VGA) 502 is added as such gain adjustment element to vary the amplitude of the RF input signal 106 for input 506 to the PA 104. The control split module 500 allows control of both the adjustable matching network 200 and the gain of VGA 502 via signals 302, 504, respectively. The advantage of including VGA 502 in the system is that VGA 502 may compensate for any non-monotonicity within the control-to-gain transfer function of the adjustable matching network 200, as well as distortion caused by the network. VGA 502 responds to the amplitude correction signal 209 at a rate at least equal to the rate of the modulation of the RF input signal 106, in order to properly correct for errors at the modulation rate. The DC (average) gain of the VGA 502 may be controlled separately, as will explained in more detail below with reference to FIG. 10B, providing a useful means of control of the PA's compression depth level.

In the example of FIG. 5B, control split module 500 splits amplitude correction signal 209 into signal 302 and signal 510. Signal 302 controls adjustable matching network 200 to adjust the output load line of PA 104, and signal 510 adjusts the bias of one or more stages of the PA 104 itself or the gain of a VGA (not shown) that may be internal to PA 104 itself. Thus PA 104 serves as a gain adjustment element with the amplitude correction loop.

In the example of FIG. 5C, control split module 500 splits amplitude correction signal 209 into signal 302 and signal 520. Signal 302 controls adjustable matching network 200 to adjust the output load line of PA 104, and signal 520 adjusts the supply voltage 540 provided to the PA 104 by the fast power supply 530 to eventually control the gain of PA 104. Fast power supply 530 controls the gain of PA 104 by adjusting PA supply voltage 540 at the rate of the amplitude modulation as indicated by amplitude correction signal 209. An example of a fast power supply is a linear regulator. Thus PA 104 supplied by fast power supply 530 serves as a gain adjustment element with the amplitude correction loop.

The third embodiments illustrated in FIGS. 5A, 5B, 5C have the benefit that the gain of the amplitude control loop may be separately adjusted based on the amplitude correction signal, in addition to adjusting the load line of the PA 104 using adjustable matching network 200. For example, the gain control polarity of the adjustable matching network 200 may reverse when the PA 104 is operating in a linear region, as opposed to when the PA 104 is operating in compression. With the addition of a separate gain control element within the amplitude control loop in addition to PA 104, the amplitude correction signal 209 may yield a net monotonic control-to-gain function without a gain control polarity reversal. Thus, stability is enhanced and the PA 104 may operate in a wide range of operating regions.

Figure 6:
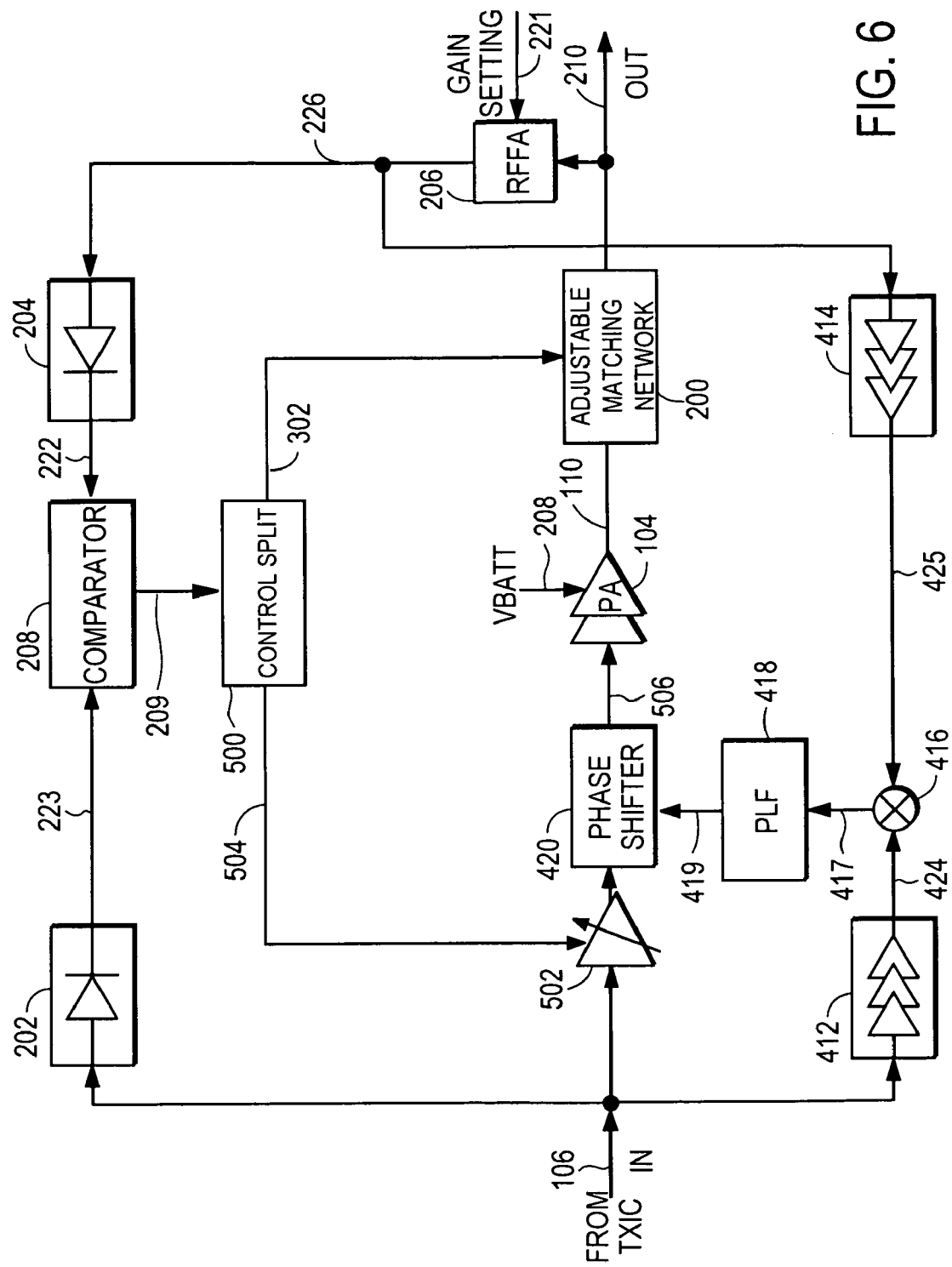
FIG. 6 illustrates an extension of the third embodiment of the present invention described in FIG. 5A.

FIG. 6 illustrates an extension of the third embodiment of the present invention described in FIG. 5A. The RF PA controller circuit of FIG. 6 is substantially the same as the RF PA controller circuit of FIG. 5A, except that a phase control loop is added. The phase control loop is substantially same as that of FIG. 4, including phase shifter 420, limiters 412, 414, comparator 416, and loop filter 418. Similar to the circuit of FIG. 4, the phase control loop corrects for unwanted phase modulation introduced by the AM to PM non-ideality of the power amplifier 104, or the adjustable matching network 200, and thus reduces phase distortion generated at the output 210. In a similar way, the phase control loop described in FIG. 6 may be added to the systems described in FIG. 5B and FIG. 5C.

While the second embodiment (FIG. 3) and third embodiments (FIGS. 5A, 5B, 5C) of the present invention are described separately herein, an arrangement combining the two is possible and may be advantageous. For example, the inclusion of power supply 310 (from the second embodiment) into the third embodiment of FIG. 5A may extend the range in which adjustable matching network 200 may adjust the load line, resulting in improved efficiency over a wider range of output power. In this case, power supply 310 of FIG. 3 and VGA 502 of FIG. 5A are controlled in combination with control split module 500, and the frequency range of the signal controlling the power supply is configured to be lower than the lowest frequency of the frequency ranges of the signals controlling the adjustable matching network and the gain control element.

Figure 7A:
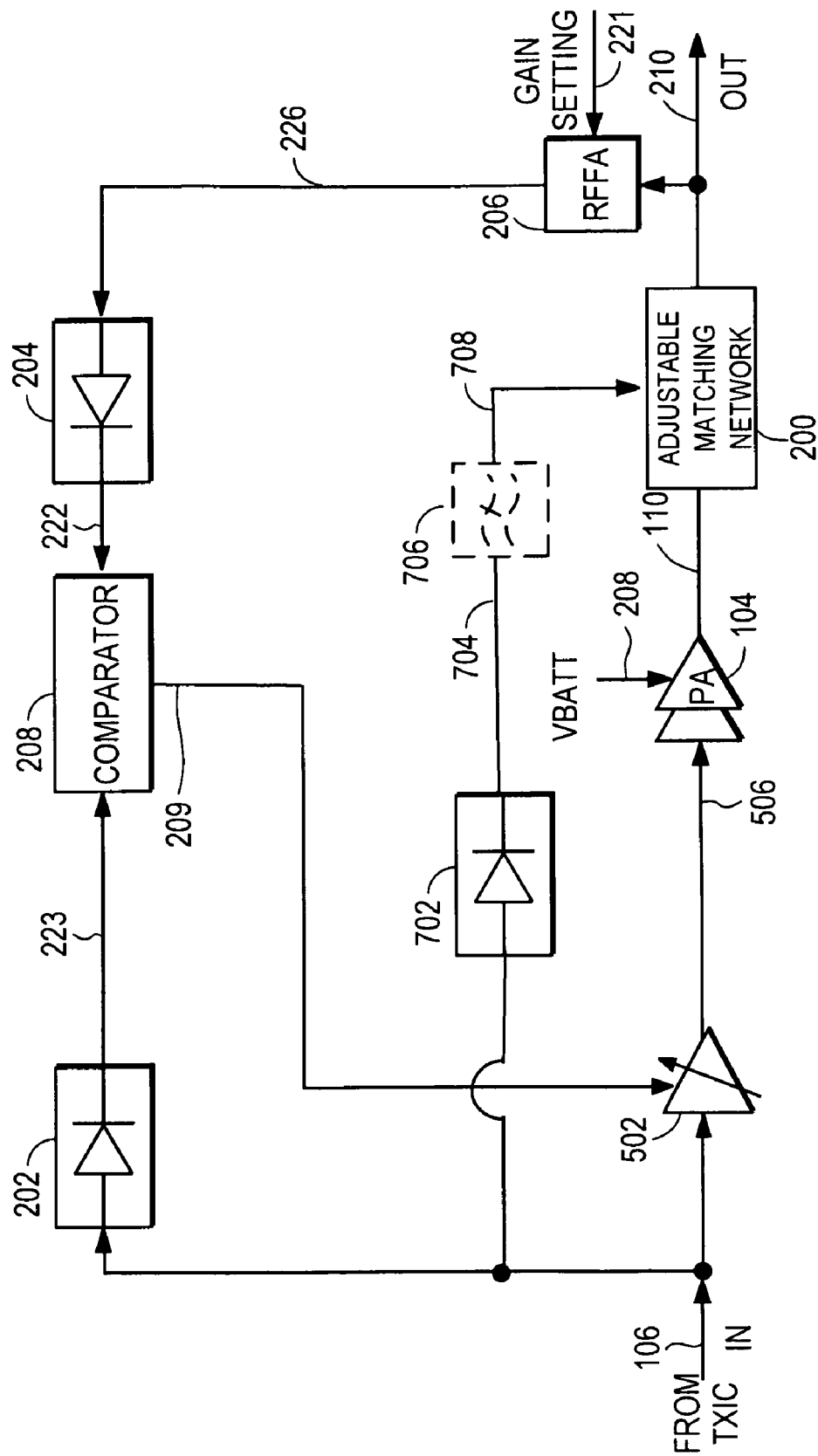
FIG. 7A illustrates an RF PA controller circuit, according to a fourth embodiment of the present invention.

FIG. 7A illustrates an RF PA controller circuit, according to a fourth embodiment of the present invention. The fourth embodiment of FIG. 7A is similar to the third embodiment of FIG. 5A, except that adjustable matching network 200 is controlled according to the amplitude of the RF signal 106 handled by the PA 104, rather than a signal derived from the amplitude correction signal 209. In other words, adjustable matching network 200 is no longer controlled within the amplitude correction loop, but instead controlled according to the amplitude of the input signal 106. Amplitude detector 702 detects the amplitude 704 of RF input signal 106 to generate control signal 708 for controlling the adjustable matching network 200. Thus adjustable matching network 200 varies the PA load line according to the input amplitude 704. For higher input amplitude 704, the load line is dynamically adjusted to permit a higher output power from PA 104, while for lower input amplitudes 704, the load line is adjusted to allow the PA 104 to run more efficiently, as will be described below in more detail with reference to FIG. 9. As in the third embodiment of FIG. 5A, the amplitude control loop, comprising amplitude detectors 202, 204, comparator 208, and RFFA (RF Feedback Attenuator)) 206, controls the gain of VGA 502 based on amplitude correction signal 209, and thus compensates for distortion that may be caused by adjustable matching network 200. Since the amplitude control loop now controls one element only (VGA 502), the control split module 506 (FIG. 5A) is not needed and the amplitude control loop is simplified.

Optional low pass filter 706 may filter the detected amplitude signal 704 to remove high frequencies of the detected amplitude signal 704 to generate the control signal 708, and thus allows adjustable matching network 200 to be controlled responsive to the average of amplitude 704 of input signal 106, rather than the instantaneous (modulation-rate) amplitude of input signal 106. The cutoff frequency of low pass filter 706 may be set to preclude frequencies at the modulation rate from controlling adjustable matching network 200. Thus, with the inclusion of low pass filter 706, adjustable matching network 200 is not responsive to follow the modulation amplitude, and so the distortion caused by the instantaneous (modulation-rate) adjustment of adjustable matching network 200 is reduced. However, a tradeoff exists, because in this case the efficiency of PA 104 is reduced as well, due to power being wasted during the a portion of the off-peak part of the amplitude of the RF input signal 106.

While FIG. 7A shows the adjustable matching network 200 controlled according to the amplitude of the input signal 106, alternative arrangements are possible which control adjustable matching network 200 according to the amplitude of the RF signal handled by the PA 104. For example, amplitude detector 702 may be re-configured to sense the amplitude of the RF input signal 106 at the output of VGA 502, at the output of PA 104, or it may sense signals within PA 104 that indicate the level of the amplitude of the RF signal handled by the PA 104, and use such detected amplitude to control adjustable matching network 200.

Figure 7B:
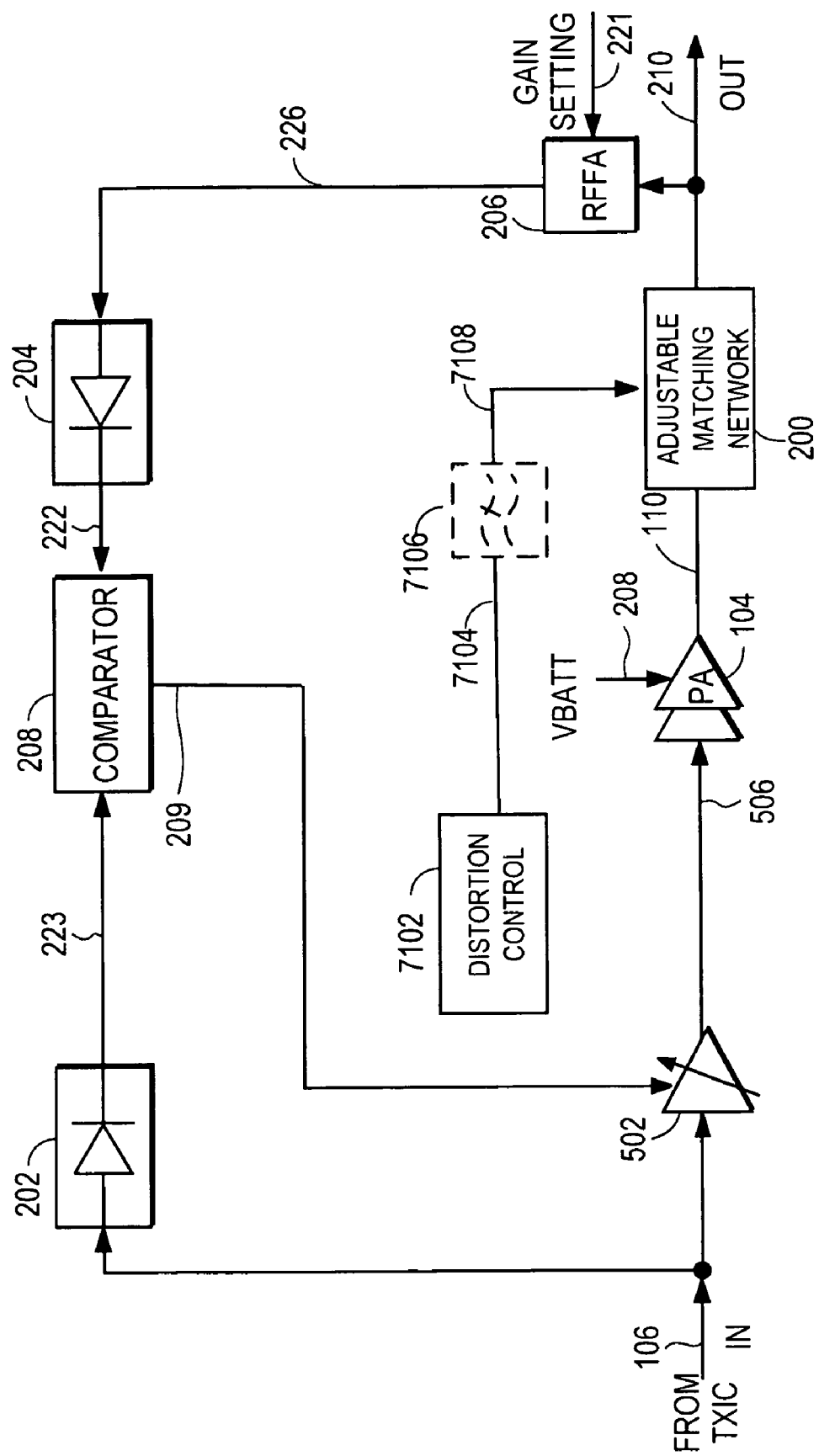
FIG. 7B illustrates another variation of the RF PA controller circuit according to the fourth embodiment of the present invention.

FIG. 7B illustrates another variation of the RF PA controller circuit according to the fourth embodiment of the present invention. This example is similar to the fourth embodiment of FIG. 7A, except that adjustable matching network 200 is controlled by distortion control module 7102. Distortion control module 7102 determines the level of distortion at output 210, compares the determined level of distortion with a predetermined acceptable distortion level, and adjusts the adjustable matching network 200 until the distortion level derived at output 210 is approximately equal to the predetermined acceptable distortion level. The acceptable distortion level may be chosen to ensure adjacent—and alternate—channel power levels meet cellular telephone standards. An example of operation is as follows: if the distortion level at output 210 is too high, adjustable matching network 200 may be adjusted in a manner that provides more headroom to PA104 (or forces PA104 to operate to a lower level of compression), and thus yield a lower distortion. Conversely if the distortion level at output 210 is too low, adjustable matching network 200 may be adjusted to reduce headroom to PA 104 (or forces PA 104 to operate to a higher level of compression), increasing efficiency. Thus a servo loop is established to properly control adjustable matching network 200 to achieve good efficiency for PA 104 without causing excessive distortion.

In addition, while the fourth embodiment of FIG. 7A and FIG. 7B are based on the third embodiment of FIG. 5A, with VGA 502 as the gain controlling element within the amplitude correction loop, other examples of the fourth embodiment of the invention can be based instead on other variations of the third embodiment as shown in FIG. 5B and FIG. 5C, which utilize PA 104 and fast power supply 530, respectively, as the gain controlling elements within the amplitude correction loop.

Figure 8:
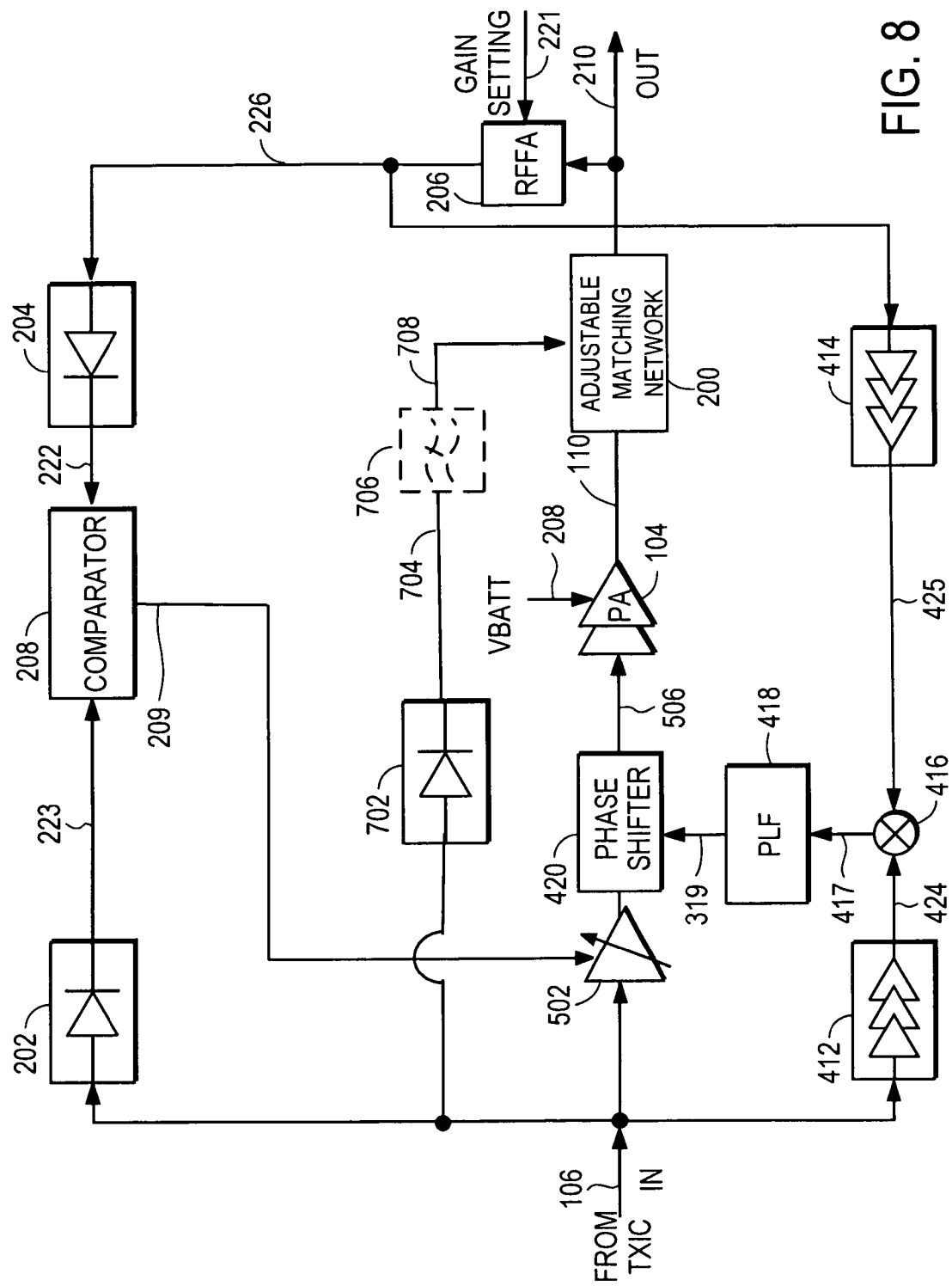
FIG. 8 illustrates an extension of the fourth embodiment of the present invention described in FIG. 7A.

FIG. 8 illustrates an extension of the fourth embodiment of the present invention described in FIG. 7A. The RF PA controller circuit of FIG. 8 is substantially the same as the RF PA controller circuit of FIG. 7A, except that a phase control loop is added. The phase control loop is substantially same as that of FIG. 4, including phase shifter 420, limiters 412, 414, comparator 416, and loop filter 418. The phase control loop corrects for unwanted phase modulation introduced by the AM to PM non-ideality of the power amplifier 104, or the adjustable matching network 200, and thus reduces phase distortion generated at the output 210.

Figure 9:
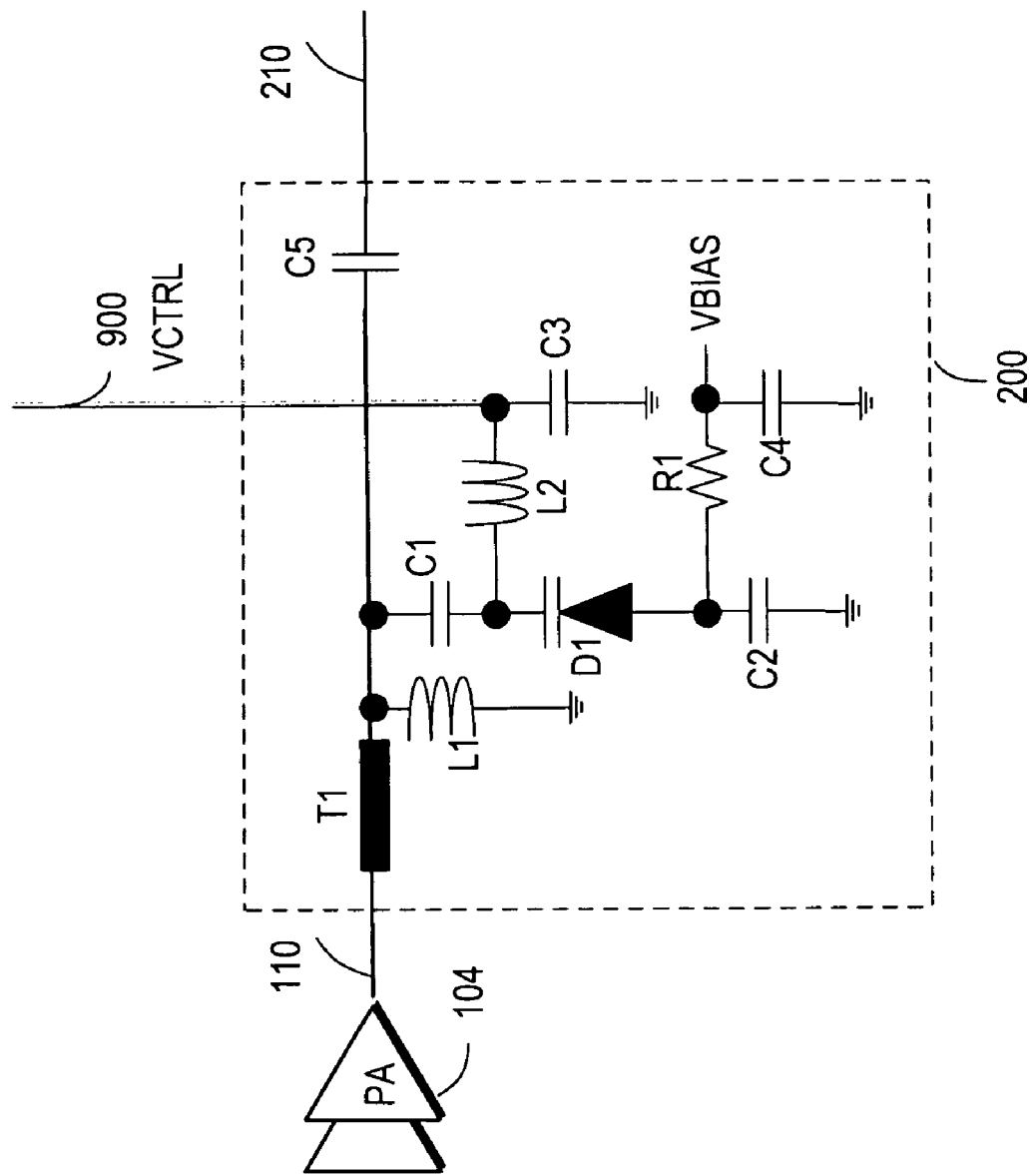
FIG. 9 illustrates an example of the adjustable matching network, according to one embodiment of the present invention.

FIG. 9 illustrates an example of the adjustable matching network, according to one embodiment of the present invention. The adjustable matching network 200 of FIG. 9 may be used with any one of the embodiments of FIGS. 1-4, 5A, 5B, 5C, and 6, 7A, 7B, and 8. Thus, signal VCTRL 900 controlling the adjustable matching network 200 may be the amplitude correction signal 209 if used with the embodiment of FIG. 2, control signal 302 if used with the embodiments described in FIGS. 3, 4, 5A, 5B, 5C, 6, or control signal 708 if used with the embodiment described in FIGS. 7A and 8, or control signal 7108 if used with the embodiment described in FIG. 7B. Note that the embodiment of FIG. 9 is merely an example of the adjustable matching network 200, and other types of adjustable matching networks may be used with the various embodiments of the present invention.

Referring to FIG. 9, a combination of series transmission line T1 and shunt capacitance (comprising the capacitance of varactor diode D1, capacitor C1 and capacitor C2) form a network which varies the drive point impedance as seen by PA 104 at its output 110. When the adjustable match control signal (VCTRL) voltage 900 is decreased, the capacitance value of varactor diode D1 increases, causing higher impedance to be seen by PA 104 at output 110. Effectively the PA load line is thus changed, causing PA 104 to operate either closer to compression (if operating in a linear region), or further into compression (if operating in the compression region), while simultaneously modulating the PA gain. By controlling the adjustable match control signal (VCTRL) 900, the amplitude loop may be closed.

The anode of varactor diode D1 is biased by bias voltage VBIAS, with resistor R1 providing AC isolation to the shunt capacitance path. The cathode of varactor diode D1 is controlled by the adjustable match control signal voltage (VCTRL) 900, allowing an adjustment of its capacitance, with inductor L2 providing AC isolation. Inductor L1 resonates some of the static capacitance of capacitors C1 and C2, increasing the capacitance adjustment range of varactor diode D1. Capacitors C3 and C4 reduce noise from the VCTRL and VBIAS lines. Capacitor C5 is used for DC blocking.

Figure 10A:
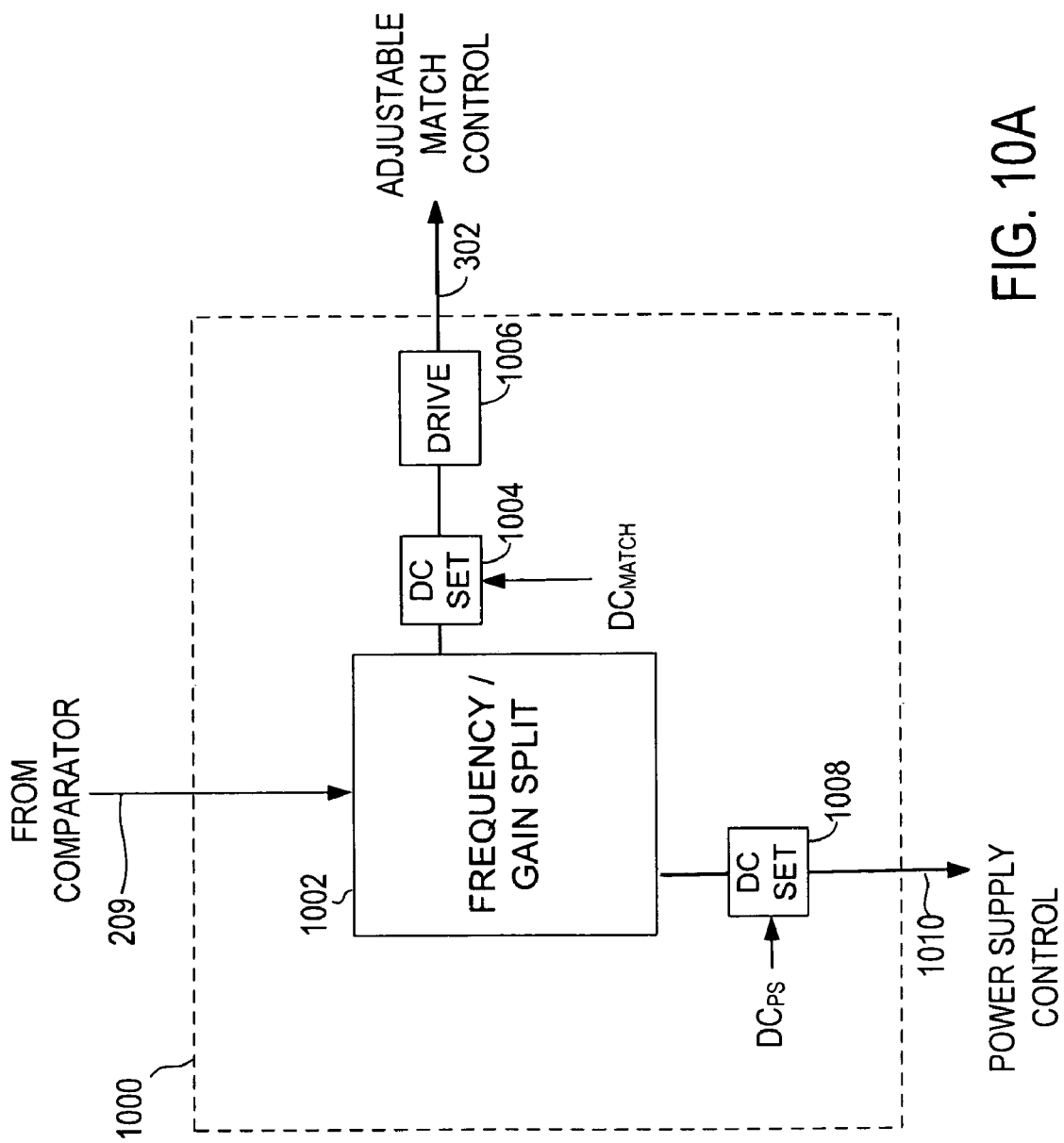
FIG. 10A illustrates an example of the control split module according to one embodiment of the present invention.

FIG. 10A illustrates an example of the control split module 1000, according to one embodiment of the present invention. The control split module 1000 shown in FIG. 10A is configured for use with the second embodiment of FIGS. 3 and 4, in which the amplitude correction loop controls the adjustable matching network 200 as well as a power supply to the PA 104. Thus, control split module 1000 may correspond to control split module 300 in FIGS. 3 and 4. The power supply control signal 1010 shown in FIG. 10A may be the power supply control signal 309 in the embodiments of FIGS. 3 and 4. Note that the embodiment of FIG. 10A is merely an example of the control split module 1000, and other types of control split modules may be used with the various embodiments of the present invention.

In the embodiment of FIG. 10A, amplitude correction signal 209 is split into at least two paths including adjustable match control signal 302 and power supply control signal 1010, to control adjustable matching network 200 using adjustable match control signal 302. Frequency gain/split module 1002 passes generally lower frequency components of amplitude correction signal 209 to power supply control signal 1010, while generally higher frequency components of amplitude correction signal 209 are passed to adjustable match control signal 302. The frequency ranges provided to the power supply control signal 1010 and adjustable match control signal 302 may overlap to some extent. The frequency range of the amplitude correction signal 209 provided to the power supply control signal 1010 may includes frequencies lower than the lowest frequencies of the frequency range of the adjustable match control signal 302 provided to adjustable matching network 200. As described previously, this apportioning of control is advantageous because the power supply 310 or fast power supply 530 may be most efficient if it is a switching regulator type with relatively low control bandwidth, while the adjustable matching network 200 may have a high control bandwidth and thus provide correction for high frequency components.

Additionally, differing gains may be assigned to adjustable match control signal 302 and power supply control signal 1010 by the frequency/gain split module 1002. The gain levels may be set dependent upon loop stability considerations. Filtering (not shown) of the control signals 302, 1010 to ensure overall loop stability may also be included.

The DC gain setting module 1004 adjusts the average (midpoint) setting of the adjustable match control signal 302 according to a $DC_{MATCH}$ control signal, if only AC components of the amplitude correction signal 209 are passed to the adjustable match control signal 302. Additionally, an offset may be introduced into the DC (average) voltage of power supply control signal 1010 by DC gain setting module 1008 according to the $DC_{PS}$ control signal, providing a useful means of control of the compression depth level of the PA 104. $DC_{PS}$ and $DC_{MATCH}$ control signals may be derived from a distortion control module, which effectively controls the compression depth level of the PA 104 based on an average level of distortion, as further described below with reference to FIG. 11.

Block drive 1006 is added prior to adjustable match control line 302 and may include circuitry to properly drive the adjustable matching network 200. Drive circuit 1006 typically includes a buffer/amplifier (not shown) with a gain transfer function and voltage swing capability to drive adjustable matching network 200.

Figure 10B:
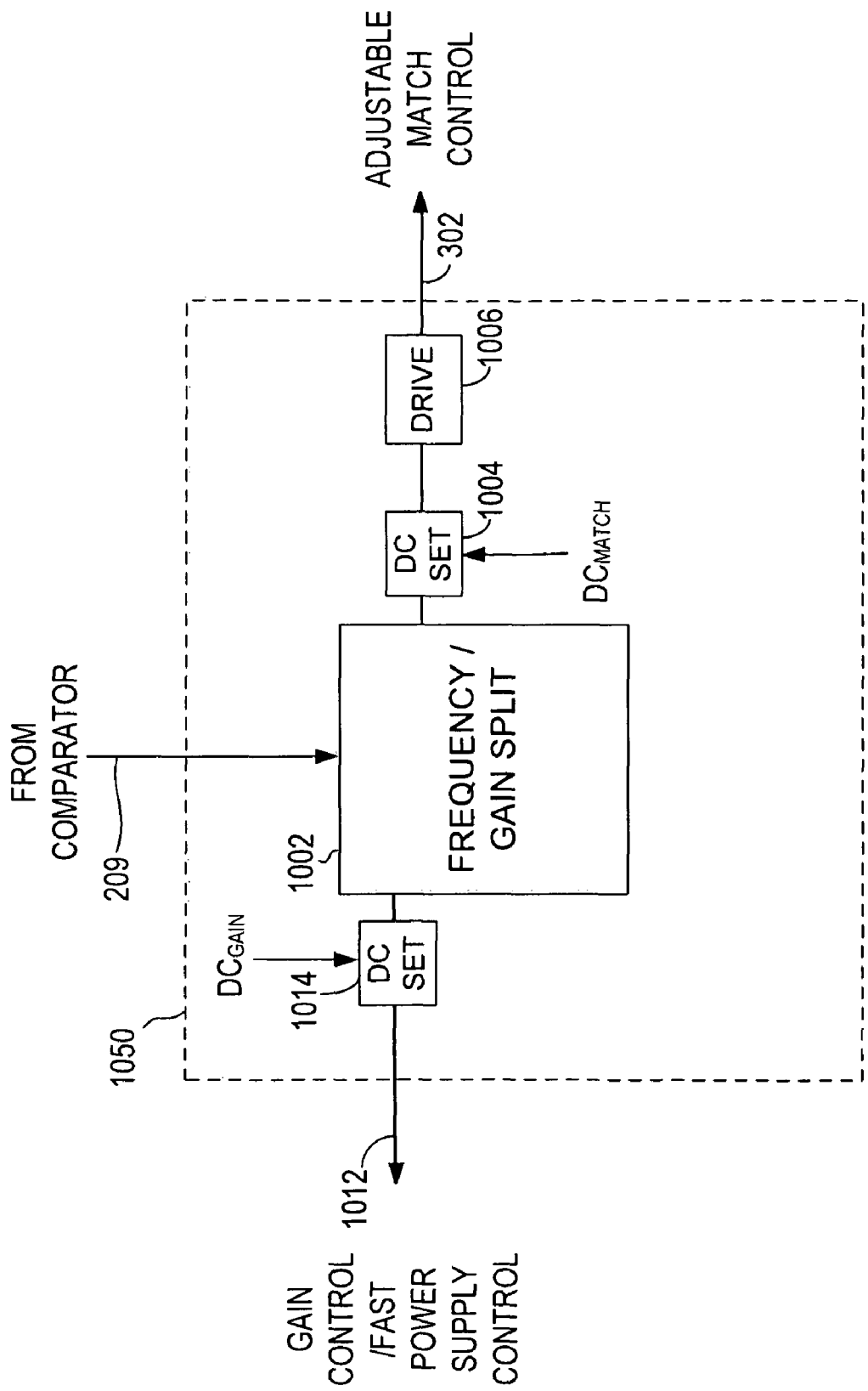
FIG. 10B illustrates an example of the control split module according to another embodiment of the present invention.

FIG. 10B illustrates an example of the control split module 1050, according to another embodiment of the present invention. The control split module 1050 shown in FIG. 10B is configured for use with the third embodiments of FIGS. 5A, 5B and 5C, in which the amplitude correction loop controls the adjustable matching network 200 as well as the gain of a gain control element (e.g., VGA 502, PA 104 itself, or fast power supply 530) in the amplitude control loop. Thus, control split module 1050 may correspond to control split module 500 in FIGS. 5A, 5B and 5C. The gain control/fast power supply control signal 1012 shown in FIG. 10B may be the VGA control signal 504 in the embodiment of FIGS. 5A, the PA gain control signal 510 in the embodiment of FIG. 5B, or the fast power supply control signal 520 in the embodiment of FIG. 5C.

In the embodiment of FIG. 10B, amplitude correction signal 209 is split into at least two paths including adjustable match control signal 302 and gain control/fast power supply control signal 1012, to control adjustable matching network 200 using adjustable match control signal 302, and to control the gain of VGA 502 or PA 104 using gain control/fast power supply control signal 1012. Frequency gain/split module 1002 adjusts the gains and frequency responses of the adjustable match control signal 302 and gain control signal 1012 to ensure overall monotonicity in the control-to-gain transfer function of the adjustable matching network 200.

For example, for use with the embodiments of FIG. 5A or FIG. 5B, gain control signal 1012 may be assigned a higher gain than adjustable match control signal 302, so that the amplitude correction loop may modulate the gain of VGA 502 (or the PA 104) to override a non-monotonic control-to-gain transfer function of the adjustable matching network 200. Similarly, for use with the embodiment of FIG. 5C, gain control/fast power supply control signal 1012 may be assigned a higher gain than the adjustable match control signal 302, so that the amplitude correction loop may modulate fast power supply 530, and thus modulate the gain of PA 104 to override a non-monotonic control-to-gain transfer function of the adjustable matching network 200. Gain control/fast power supply control signal 1012 may be also apportioned a higher frequency than adjustable match control signal 302, to ensure that VGA 504, PA 104, or fast power supply 530 can correct for distortion from the adjustable matching network 200. The DC (average) gain indicated by the gain control/fast power supply control signal 1012 may be controlled separately by a DC gain setting module 1014 according to a $DC_{GAIN}$ control signal, providing a useful means of control of the compression depth level of the PA 104. Likewise, DC gain setting module 1004 adjusts the average (midpoint) setting of the adjustable match control signal 302 according to a $DC_{MATCH}$ control signal, if only AC components of the amplitude correction signal 209 are passed to the adjustable match control signal 302. $DC_{GAIN}$ and $DC_{MATCH}$ control signals may be derived from a distortion control module, which effectively controls the compression depth level of the PA 104 based on an average level of distortion, as further described below with reference to FIG. 11. Block drive 1006 is added prior to adjustable match control line 302 and may include circuitry to properly drive the adjustable matching network 200. Drive circuit 1006 typically includes a buffer/amplifier (not shown) with a gain transfer function and voltage swing capability to drive adjustable matching network 200.

In the case of a combination of second (FIG. 3 or 4) and third embodiments (FIG. 5A, 5B, 5C, or 6) described previously, power supply 310 from FIG. 3 may be included in the system, and in this case the embodiments of the control split module 1000, 1050 in FIGS. 10A and 10B may likewise be combined such that frequency gain/split module splits amplitude correction signal 209 to at least three paths to generate gain control/fast power supply control signal 1012, power supply control signal 1010, and adjustable match control signal 302. In this case, frequency gain/split module 1002 passes the lowest frequency components of amplitude correction signal 209 to power supply control signal 1010.

Finally, note that for all embodiments of control split modules 1000, 1050 shown in FIGS. 10A and 10B, filtering, polarity adjustment, and gain shaping of the various control signals 1010, 1012, 302 may be required for stability, though they are not explicitly shown in FIGS. 10A and 10B.

Figure 11:
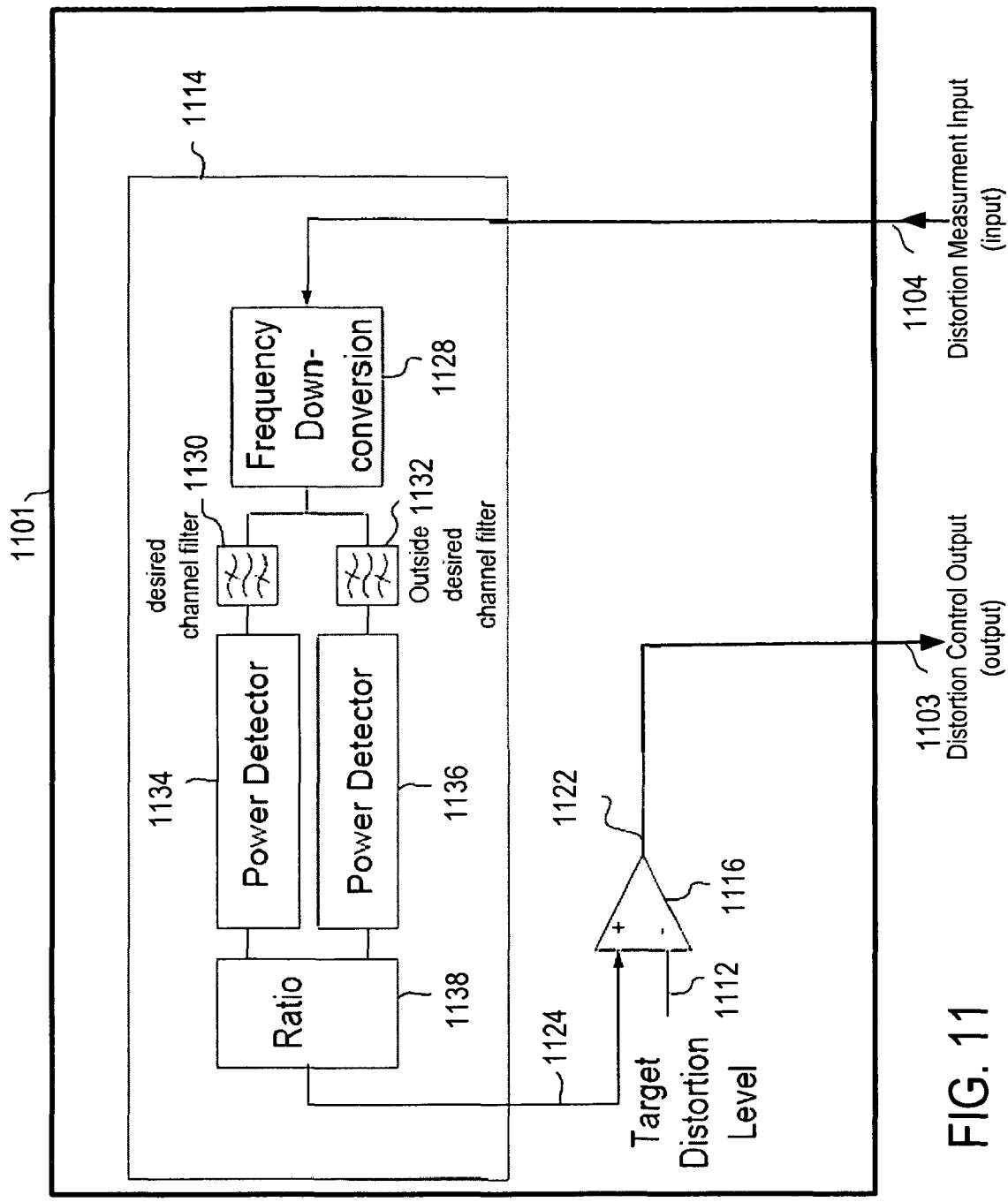
FIG. 11 illustrates an example of the distortion control module according to one embodiment of the present invention.

FIG. 11 describes a distortion control module 1101. The distortion control module samples a signal at distortion measurement input 1104 (input) and provides a distortion control output signal 1103 (output) based on the difference between the distortion determined at input 1104 and target distortion level 212. Input 1104 is typically coupled to PA output signal 210 or 226 in the relevant embodiments. In the case of the embodiment described in FIG. 7B, distortion control module 1101 is an example of distortion control module 7102, with output signal 1103 being equivalent to signal 7104. In the case of control split modules 1000 and 1050 described in FIGS. 10A and 10B, respectively, output signal 1103 of distortion control module 1101 may drive $DC_{PS}$ and $DC_{MATCH}$ control signals, and $DC_{GAIN}$ and $DC_{MATCH}$ control signals, respectively.

Returning to FIG. 11, distortion measurement module 1114 is hereby described. Distortion measurement module 1114 comprises a frequency down-conversion module 1128, a pair of filters 1130, 1132, a pair of power detectors 1134, 1136, and a ratio calculation module 1138. Input 1104 is down-converted through a frequency down-conversion module 1128. In one embodiment, the frequency down-conversion module 1128 comprises an I/Q demodulator (not shown). The frequency down-conversion module 1128 outputs the down-converted signal to two different filters: a desired channel filter 1130 and an outside desired channel filter 1132. The filters 1130, 1132 can be analog or digital filters. The desired channel filter 1130 is configured to pass frequencies within the desired channel and remove frequencies outside the desired channel. The outside desired channel filter 1132 is configured to pass frequencies within one or more ranges outside the range of the desired frequency channel. According to various embodiments, the frequency ranges passed by the outside desired channel filter 1132 can include frequencies in an adjacent channel, an alternate channel, a combination of an adjacent channel and an alternate channel, or any other combination of frequency ranges outside the desired channel. Each filter 1130, 1132 outputs a filtered signal to power detectors 1134, 1136, respectively, for determining power levels of the filtered signals. As used in combination with the desired channel filter 1130, the power detector 1134 determines and outputs a power level corresponding to the signal power in the desired channel. The power detector 1136 determines and outputs a power level corresponding to the signal power outside of the desired channel (e.g., adjacent channel power, alternate channel power, or a combination of the two). The outputs of the power detectors 1134, 1136 are coupled to the ratio calculation module 1138 to determine the ratio of the outside desired channel power to the desired channel power. The ratio of these powers is a measure of distortion 1124. For example, the measure of distortion 1124 may be given by:

Measure of distortion (1124)=output of power detector (1136)/output of power detector (1134)

The comparator 1116 compares this measured distortion level 1124 with a target distortion level 1112. As the measured PA distortion level 1124 decreases lower than the target distortion level 1112, the level of output 1103 decreases. As the measured PA distortion level 1124 increases higher than the target distortion level 1112, the level of output 1103 increases. As mentioned previously, the target distortion level 1112 may be chosen to ensure adjacent- and alternate-channel power levels meet cellular telephone standards.

Thus distortion control module 1101 is thus part of a servo loop which attempts to target a specific acceptable distortion level 1112. The operation of this loop is described previously in reference to FIG. 7B, Filtering and gain adjustment elements required for loop stability are not shown typically required to stabilize the loop.

With regards to FIGS. 10A and 10B, any of control signals $DC_{PS}$, $DC_{MATCH}$ and $DC_{GAIN}$ may be controlled by output 1103 in a similar servo loop. Output 1103 adjusts $DC_{PS}$, $DC_{MATCH}$ and/or $DC_{GAIN}$ to reduce the headroom to the PA (or force the PA to operate to a higher level of compression) when the level of output 1103 decreases, increasing the efficiency of the PA 104. Conversely, an increase in the level of output 1103 increases the headroom to the PA (or forces the PA to operate to a lower level of compression), decreasing distortion at the PA output 110.

Referring to FIG. 9 and FIGS. 10A and 10B, decreasing the headroom of PA 104 (or forcing PA 104 to operate to a higher level of compression) requires controlling $DC_{MATCH}$ in a way that decreases the adjustable match control signal (VCTRL) voltage 900, such that the capacitance value of varactor diode D1 increases, thereby causing higher impedance to be seen by PA 104 at output 110.

Referring to FIG. 10A and FIG. 3, decreasing the headroom of PA 104 (or forcing PA 104 to operate to a higher level of compression) requires controlling $DC_{PS}$ to decrease the average power supply voltage of power supply 310, and vice versa.

Referring to FIG. 10B and FIGS. 5A and 5B, decreasing the headroom of PA 104 (or forcing PA 104 to operate to a higher level of compression) requires controlling $DC_{GAIN}$ to increase the average gain of VGA 502 or PA 104. Referring to FIG. 10B and FIG. 5C, decreasing the headroom of PA 104 (or forcing PA 104 to operate to a higher level of compression) requires controlling $DC_{GAIN}$ to decrease the average power supply voltage of fast power supply 530, and vice versa.

Note that while FIG. 11 describes in detail a method for determining the level of distortion at the PA output, other methods may be substituted and are still within the spirit of the invention.

Upon reading this disclosure, those of skill in the art will appreciate still additional alternative designs for output impedance modulation in a power amplifier system. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the present invention.

What is claimed is:

1. A radio frequency (RF) power amplifier circuit, comprising:
    a power amplifier coupled to receive and amplify an RF input signal to generate an RF output signal;
    a power amplifier controller including an amplitude control loop determining an amplitude correction signal indicative of an amplitude difference between an amplitude of the RF input signal and an attenuated amplitude of the RF output signal; and
    an adjustable matching network coupled to an output of the power amplifier, the amplitude control loop controlling the adjustable matching network to adjust a load line of the power amplifier based on the amplitude correction signal.

2. The RF power amplifier circuit of claim 1, wherein the amplitude control loop controls the adjustable matching network to adjust the load line of the power amplifier to allow the power amplifier to operate in a compressed region.

3. The RF power amplifier circuit of claim 1, further comprising a power supply generating an adjusted supply voltage provided to the power amplifier based upon the amplitude correction signal.

4. The RF power amplifier circuit of claim 3, wherein the power supply is a switch-mode type.

5. The RF power amplifier circuit of claim 3, wherein:
    the power supply receives a first portion of the amplitude correction signal in a first frequency range and generates an adjusted supply voltage provided to the power amplifier based upon the first portion of the amplitude correction signal; and
    the adjustable matching network receives a second portion of the amplitude correction signal in a second frequency range and adjusts the load line of the power amplifier based upon the second portion of the amplitude correction signal.

6. The RF power amplifier circuit of claim 5, wherein the first frequency range includes frequencies lower than the lowest frequencies of the second frequency range.

7. The RF power amplifier circuit of claim 3, wherein an average of the adjusted supply voltage of the power supply is set such that the power amplifier operates in a compressed region.

8. The RF power amplifier circuit of claim 3, further comprising:
    a phase control loop determining a phase error signal indicative of a phase difference between phases of the RF input signal and the RF output signal and adjusting the phase of the RF input signal to reduce phase distortion generated by the RF power amplifier circuit.

9. The RF power amplifier circuit of claim 1, further comprising at least a gain element for adjusting gain within the amplitude control loop, and wherein:
    the adjustable matching network receives a first portion of the amplitude correction signal and adjusts the load line of the power amplifier based upon the first portion of the amplitude correction signal; and
    the gain element receives a second portion of the amplitude correction signal and controls the gain within the amplitude control loop based upon the second portion of the amplitude correction signal; and wherein
    the gain element responds to the amplitude correction signal at a rate at least equal to a rate of modulation of the RF input signal.

10. The RF power amplifier circuit of claim 9, wherein the power amplifier operates in both a compressed and linear region.

11. The RF power amplifier circuit of claim 9, wherein an average gain of the gain element is set separately by a DC control signal instead of the amplitude correction signal.

12. The RF power amplifier circuit of claim 9, wherein an average gain of the gain element is set based on a distortion level of the RF output signal.

13. The RF power amplifier circuit of claim 9, wherein an average load line of the adjustable matching network is set separately by a DC control signal instead of the amplitude correction signal.

14. The RF power amplifier circuit of claim 9, wherein an average load line of the adjustable matching network is set based on a distortion level of the RF output signal.

15. The RF power amplifier circuit of claim 9, wherein the gain element is a variable gain amplifier coupled between the RF input signal and the power amplifier.

16. The RF power amplifier circuit of claim 9, wherein the gain element corresponds to a bias adjustment for the power amplifier or a variable gain amplifier internal to the power amplifier.

17. The RF power amplifier circuit of claim 9, wherein the gain element is a power supply supplying power to the power amplifier.

18. The RF power amplifier circuit of claim 9, further comprising
    a phase control loop determining a phase error signal indicative of a phase difference between phases of the RF input signal and the RF output signal and adjusting the phase of the RF input signal to reduce phase distortion generated by the RF power amplifier circuit.

19. The RF power amplifier circuit of claim 9, further comprising a power supply generating an adjusted supply voltage provided to the power amplifier based upon the amplitude correction signal, and wherein:
    the power supply receives a first portion of the amplitude correction signal in a first frequency range and generates the adjusted supply voltage provided to the power amplifier based upon the first portion of the amplitude correction signal; and
    the adjustable matching network receives a second portion of the amplitude correction signal in a second frequency range and adjusts the load line of the power amplifier based upon the second portion of the amplitude correction signal; and
    the gain element receives a third portion of the amplitude correction signal in a third frequency range and adjusts the gain within the amplitude control loop based upon the third portion of the amplitude correction signal; and
    wherein the first frequency range includes frequencies lower than the lowest frequencies of the second frequency range or the third frequency range.

20. A radio frequency (RF) power amplifier circuit, comprising:
    a power amplifier coupled to receive and amplify an RF input signal to generate an RF output signal;
    a power amplifier controller including an amplitude control loop determining an amplitude correction signal indicative of an amplitude difference between an amplitude of the RF input signal and an attenuated amplitude of the RF output signal;

a gain element receiving the amplitude correction signal and controlling a gain within the amplitude control loop based upon the amplitude correction signal; and an adjustable matching network coupled to an output of the power amplifier, the adjustable matching network adjusting a load line of the power amplifier based on an amplitude of an RF signal within the amplitude control loop.

21. The RF power amplifier circuit of claim 20, further comprising:

a low pass filter receiving an amplitude signal indicative of the amplitude of the RF input signal to provide a control signal indicative of an average of the amplitude of the RF input signal to the adjustable matching network, the adjustable matching network adjusting the load line of the power amplifier based on the average of the amplitude of the RF input signal.

22. The RF power amplifier circuit of claim 21, wherein the adjustable matching network adjusts the load line of the power amplifier based on a distortion level of the RF output signal instead of the average of the amplitude of the RF input signal.

23. The RF power amplifier circuit of claim 22, wherein the distortion level of the RF output signal comprises a ratio of a first output power of a first portion of the RF output signal outside a desired frequency channel to a second output power of a second portion of the RF output signal within the desired frequency channel.

24. The RF power amplifier circuit of claim 20, further comprising:

a phase control loop determining a phase error signal indicative of a phase difference between phases of the RF input signal and the RF output signal and adjusting the phase of the RF input signal to reduce phase distortion generated by the RF power amplifier circuit.

* * * * *